United States Patent
Dip et al.

(10) Patent No.: US 7,632,354 B2
(45) Date of Patent: Dec. 15, 2009

(54) THERMAL PROCESSING SYSTEM WITH IMPROVED PROCESS GAS FLOW AND METHOD FOR INJECTING A PROCESS GAS INTO A THERMAL PROCESSING SYSTEM

(75) Inventors: Anthony Dip, Cedar Creek, TX (US); Shinji Asari, Austin, TX (US); Meenakshisundaram Gandhi, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/463,180

(22) Filed: Aug. 8, 2006

(65) Prior Publication Data
US 2008/0035055 A1 Feb. 14, 2008

(51) Int. Cl.
*C23C 16/455* (2006.01)
*H01L 21/302* (2006.01)

(52) U.S. Cl. .................. 118/715; 118/724; 118/728; 156/345.33; 156/345.34

(58) Field of Classification Search .......... 118/715, 118/724, 728; 156/345.33, 345.34
See application file for complete search history.

(56) References Cited

U.S. PATENT DOCUMENTS

| | | | | |
|---|---|---|---|---|
| 5,458,685 | A * | 10/1995 | Hasebe et al. | 118/724 |
| 5,902,103 | A | 5/1999 | Maeda et al. | |
| 6,146,461 | A * | 11/2000 | Yang et al. | 118/715 |
| 2003/0024477 | A1 | 2/2003 | Okuda et al. | |
| 2003/0164143 | A1 | 9/2003 | Toyoda et al. | |
| 2004/0025786 | A1 | 2/2004 | Kontani et al. | |
| 2006/0216418 | A1 | 9/2006 | Matsuura | |
| 2006/0216950 | A1 | 9/2006 | Matsuura | |
| 2007/0007646 | A1 * | 1/2007 | Yamaguchi et al. | 257/727 |
| 2007/0062646 | A1 * | 3/2007 | Ogawa et al. | 156/345.29 |

FOREIGN PATENT DOCUMENTS

| | | | |
|---|---|---|---|
| JP | 2003024718 A | | 1/1991 |
| JP | 2002-280378 | * | 1/2002 |
| JP | 2002-280378 A | | 9/2002 |

(Continued)

OTHER PUBLICATIONS

European Patent Office, International Search Report issued in corresponding PCT Application serial No. PCT/US2007/068474 dated Dec. 6, 2007.

*Primary Examiner*—Jeffrie R Lund
*Assistant Examiner*—Satish Chandra
(74) *Attorney, Agent, or Firm*—Wood, Herron & Evans LLP

(57) ABSTRACT

A thermal processing system with improved gas flow and method for injecting a process gas into a thermal processing system. The thermal processing system has an injection section with injection outlets that inject process gas into a processing space and a delivery section that delivers process gas to the injection section. The delivery section may be coupled with the injection section at an inlet disposed between opposite ends of the injection section. A fluid lumen of the injection section may have a larger cross-sectional area than a fluid lumen of the delivery section. The thermal processing system may include an inner tube, which surrounds the processing space, having a slit through which the processing space communicates with an annular pumping space defined between the inner tube and an outer tube of the thermal processing system.

4 Claims, 10 Drawing Sheets

FOREIGN PATENT DOCUMENTS

| | | | |
|---|---|---|---|
| JP | 2006-080098 | * | 9/2002 |
| JP | 2002222806 A | | 9/2002 |
| JP | 2005-209668 | * | 8/2005 |
| JP | 2005209668 | * | 8/2005 |
| JP | 2006080098 A | | 3/2006 |
| JP | 2006080101 A | | 3/2006 |
| WO | WO2004027846 A1 | | 1/2004 |

* cited by examiner

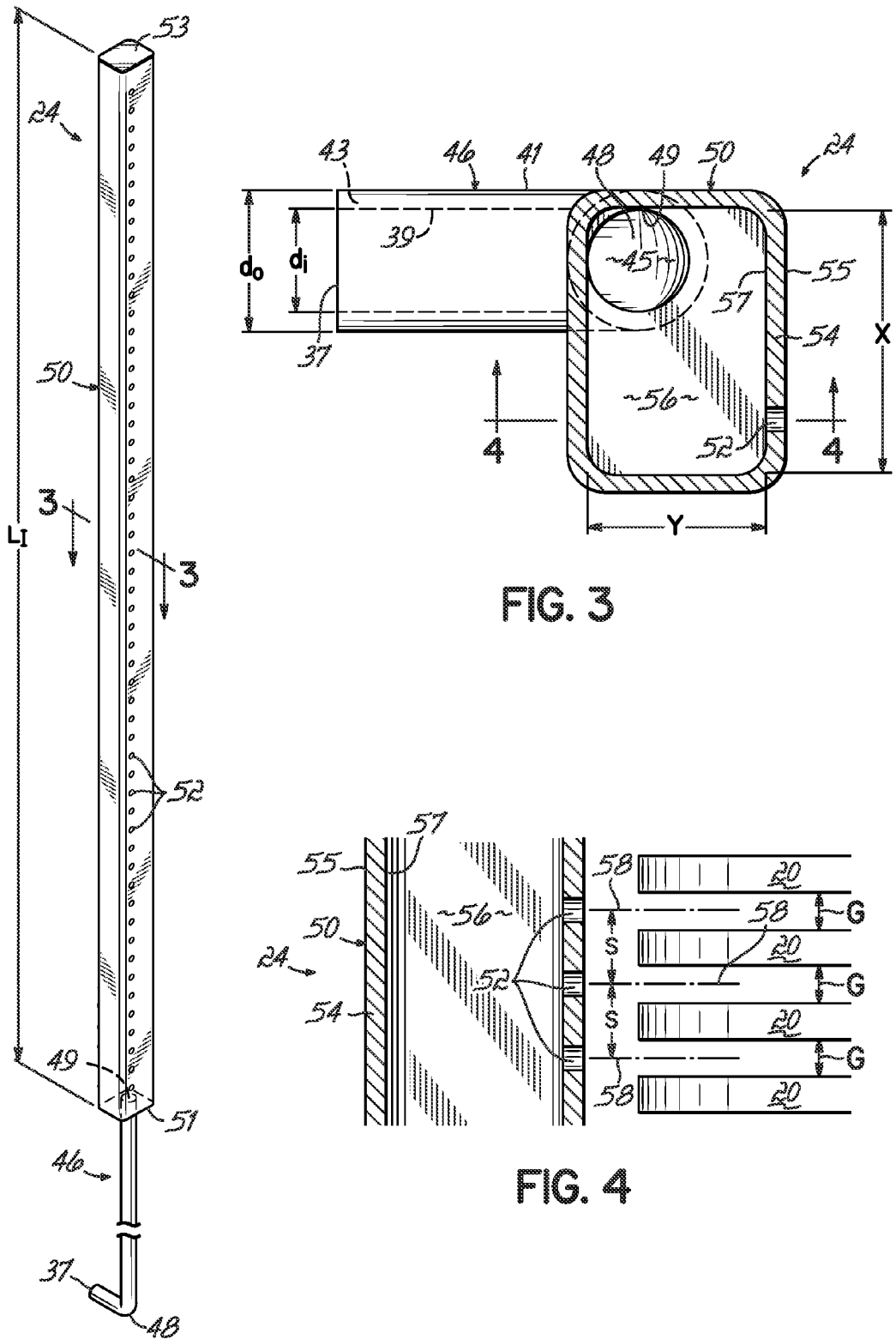

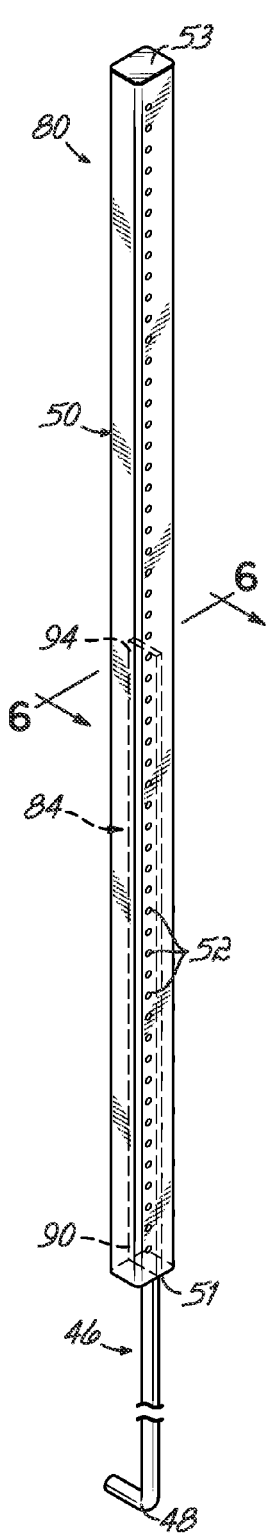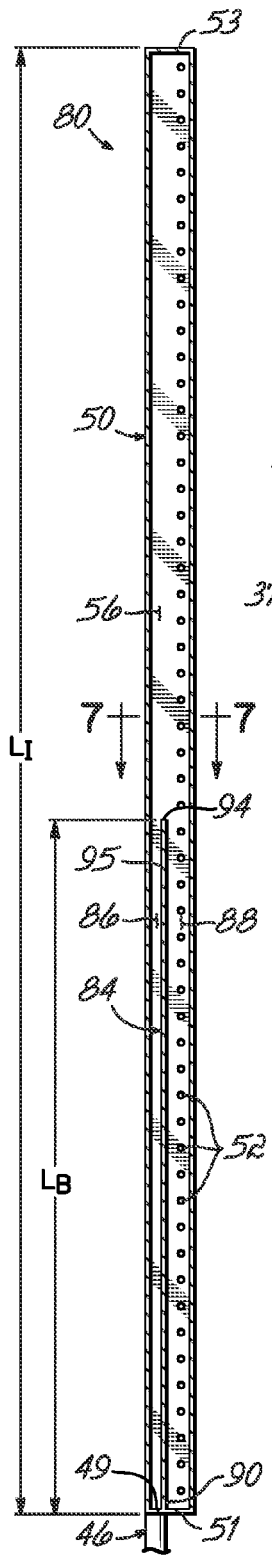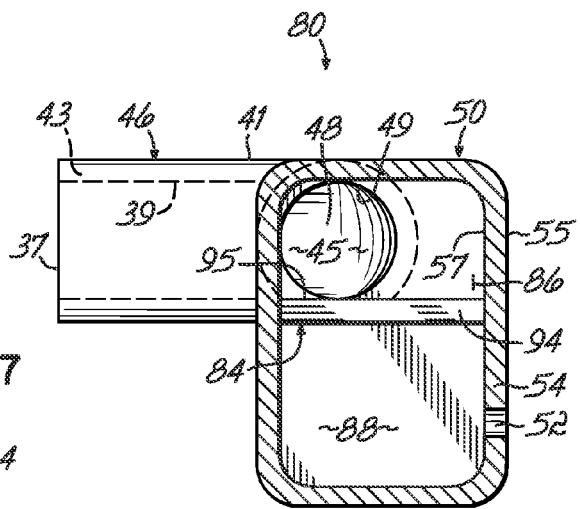

US 7,632,354 B2

THERMAL PROCESSING SYSTEM WITH IMPROVED PROCESS GAS FLOW AND METHOD FOR INJECTING A PROCESS GAS INTO A THERMAL PROCESSING SYSTEM

FIELD OF THE INVENTION

This invention relates to the field of semiconductor processing, and, more particularly, to thermal processing systems with improved process gas flow and methods for injecting a process gas into a thermal processing system.

BACKGROUND OF THE INVENTION

Thermal processing systems are commonly used to perform a variety of semiconductor fabrication processes, including but not limited to oxidation, diffusion, annealing, and chemical vapor deposition (CVD). Most conventional thermal processing systems employ a processing chamber that is oriented either horizontally or vertically. Vertical thermal processing systems are recognized to generate fewer particles during processing, which reduces substrate contamination, are readily automated, and require less floor space because of their relatively small footprint.

Many conventional thermal processing systems include a structural outer tube defining a vacuum vessel, a cylindrical liner inside the outer tube and surrounding a processing space, a heater disposed outside of the outer tube, and a gas injector comprising an annular quartz conduit or tube. A carrier or boat, which is supported on a pedestal in vertical thermal processing systems, holds a stack of substrates in the processing space. The boat includes uniformly spaced slots that receive the individually held substrates. Confronting faces of adjacent substrates in the stack are separated by a narrow gap for process gas flow. The gas injector includes an injection section extending along a major portion of the length of the liner and a line of gas injection openings in the injection section that inject process gas into the processing space. The gas injector also includes a gas delivery section seamlessly coupled with the injection section for delivering a continuous stream of process gas to the injection section.

The inlet and delivery sections of conventional gas injectors comprise continuous lengths of a tubular conduit having an unbroken fluid lumen with a round, annular cross-sectional profile of uniform inner diameter and cross-sectional area. Typical inner and outer diameters for the tubular conduit are about 11.4 mm and about 14.0 mm, respectively.

The liner is equipped with a series of disk-shaped gas exhaust openings that also extend along the length of the liner. The gas exhaust openings are located diametrically opposite to the gas injection openings in the gas injector, which promotes a cross flow of process gas across the diameter of the liner and the substrates held by the boat in the processing space radially inside the inner diameter of the liner. The gas exhaust openings communicate with an annular pumping space defined between the liner and the outer tube. A pumping port in the outer tube communicates with the annular pumping space. The annular pumping space is evacuated by a vacuum pump through a foreline coupled with the pumping port.

The process gas streams directed through the gaps between adjacent substrates reacts with the constituent material of the substrates to form a surface layer or, alternatively, to promote a different physical or chemical surface process. The thickness and composition uniformity of the layer formed on the substrates is sensitive to various factors such as the uniformity of the gas injection, the cross flow of the process gas, and the exhaust of the reaction products and unreacted process gas. The internal resistance of the gas injector, which is proportional to the pressure drop across each gas injection opening, may be a dominant factor in determining the final flow distribution for gas injected from the gas injector into the processing space. To improve layer uniformity, conventional thermal processing systems configure the gas injection openings and gas exhaust openings to promote uniform cross flow of the process gas.

One conventional measure often taken is to dimension the gas injection openings so that their diameter is larger near the terminal end of the gas injector most remote from the substrate nearest to the process gas entry point into the liner. The disparity in the diameter may be significant between gas injection openings near the gas entry point and gas injection openings near the remote terminal end of the gas injector. Each successive gas injection opening represents a pressure drop to the process gas flowing inside the injection section of the gas injector to downstream gas injection openings. The changing diameter attempts to compensate for changes in the pressure of the process gas flow that occurs along the length of the gas injector. For example, the diameter of the gas injection openings may be about 0.5 mm over the majority of the length of the gas injector and about 0.8 mm near the remote terminal end of the gas injector. As a result, the mass flux through the larger gas injection openings may be significantly greater than the mass flux through the smaller gas injection openings, which impacts the distribution of the process gas injected into the processing space along the length of the gas injector.

Another conventional measure often taken to improve process uniformity is to progressively increase the diameter of round gas exhaust openings that are defined along the length of the liner. Specifically, a gas exhaust opening having the smallest diameter is located near the pumping port and foreline and the diameter of adjacent gas exhaust openings increases with increasing separation between the pumping port and the foreline. Consequently, the gas exhaust opening having the largest diameter is the most distant gas exhaust opening from the pumping port and foreline.

Despite reliance on these conventional measures, thermal processing systems may form layers on the substrates during a processing run that exhibit thickness and composition non-uniformities. Specifically, the layers formed on a batch or lot of processed substrates may exhibit a thickness and composition dependence that is contingent upon their location in the processing space relative to the pumping port and the gas injector. Moreover, these conventional measures may also be ineffective for preventing thickness and composition non-uniformities among different lots of processed substrates.

The use of progressive-diameter gas exhaust openings introduces non-uniformities into the dispersion of the gas during cross flow. Specifically, different points on the circumference of each of the round openings are closer to the pumping port and foreline than other points on the circumference. The resulting pressure differential across the width of each gas exhaust opening may cause different process gas flows across the different faces of adjacent substrates, which promotes layer non-uniformities. Any gas exhaust openings located either above or below the boat may be characterized a low conductance to the pumping port and, thereby, result in a significant loss of process gas near the top and bottom of the substrate stack.

Any open space between the pumping port and the adjacent base of the boat may also contribute to thickness and composition non-uniformities among substrates processed in conventional thermal processing systems. These open spaces may detrimentally influence the pumping conductance, which is a measure of the ease with which gas will flow through a section of a vacuum system. Specifically, any open space between the pedestal and boat in thermal processing systems represents a substantially empty volume that is located between the gas exhaust openings in the liner and the pumping port. The flow of the exhausted process gas in the annular pumping space encounters this open space before reaching the pumping port. As a consequence, the flow of the exhausted process gas flow may be impeded and retarded, which may reduce the pumping conductance.

There is thus a need for a thermal processing system with improved process gas delivery and method for delivering process gas in a thermal processing system that overcomes these and other deficiencies of conventional thermal processing systems.

SUMMARY OF THE INVENTION

One embodiment of the invention provides a thermal processing system having a gas injector with an injection section and a delivery section with a fluid lumen communicating process gas to a fluid lumen of the gas injection section at an inlet. Injection outlets are distributed between opposite first and second ends of the injection section. The injection outlets are configured to inject process gas from the fluid lumen of the injection section into a processing space inside the thermal processing system. The fluid lumen of the injection section has a larger cross-sectional area than the fluid lumen of the delivery section. In certain alternative embodiments, the inlet may be disposed between the first and second ends of the injection section.

Another embodiment of the invention provides a thermal processing system having an outer tube and an inner tube disposed radially inside the outer tube such that the inner and outer tubes are separated by an annular pumping space. An injection section of a gas injector is positioned inside the inner tube. The inner tube is arranged about an azimuthal axis extending through the processing space. The injection section has injection outlets distributed along a length, which is measured parallel to the azimuthal axis, and configured to inject process gas into a processing space defined inside the inner tube. The inner tube includes a slit having a length substantially aligned with the length of the injection section. The processing space and annular pumping space communicate through the slit.

Another embodiment of the invention provides a method for delivering a process gas to a thermal processing system. The thermal processing system includes a liner enclosing a processing space and a gas injector with an injection section disposed in the processing space. The injection section has a fluid lumen and injection outlets communicating with the lumen. The method comprises delivering a stream of the process gas to an inlet of the injection section located between opposite ends of the injection section of the gas injector. The stream of the process gas from the inlet is divided to flow in the fluid lumen toward each of the opposite ends of the injection section. The process gas is injected from the injection outlets of the injection section into the processing space.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 2 is an isometric view of the gas injector of FIG. 1;

FIG. 3 is a cross-sectional view taken generally along line 3-3 of FIG. 2;

FIG. 4 is a cross-sectional view taken generally along line 4-4 of FIG. 3;

FIG. 5 is an isometric view similar to FIG. 2 of a gas injector in accordance with an alternative embodiment of the invention;

FIG. 6 is a cross-sectional view taken generally along line 6-6 of FIG. 5;

FIG. 7 is a cross-sectional view taken generally along line 7-7 of FIG. 6;

DETAILED DESCRIPTION

Figure 1:
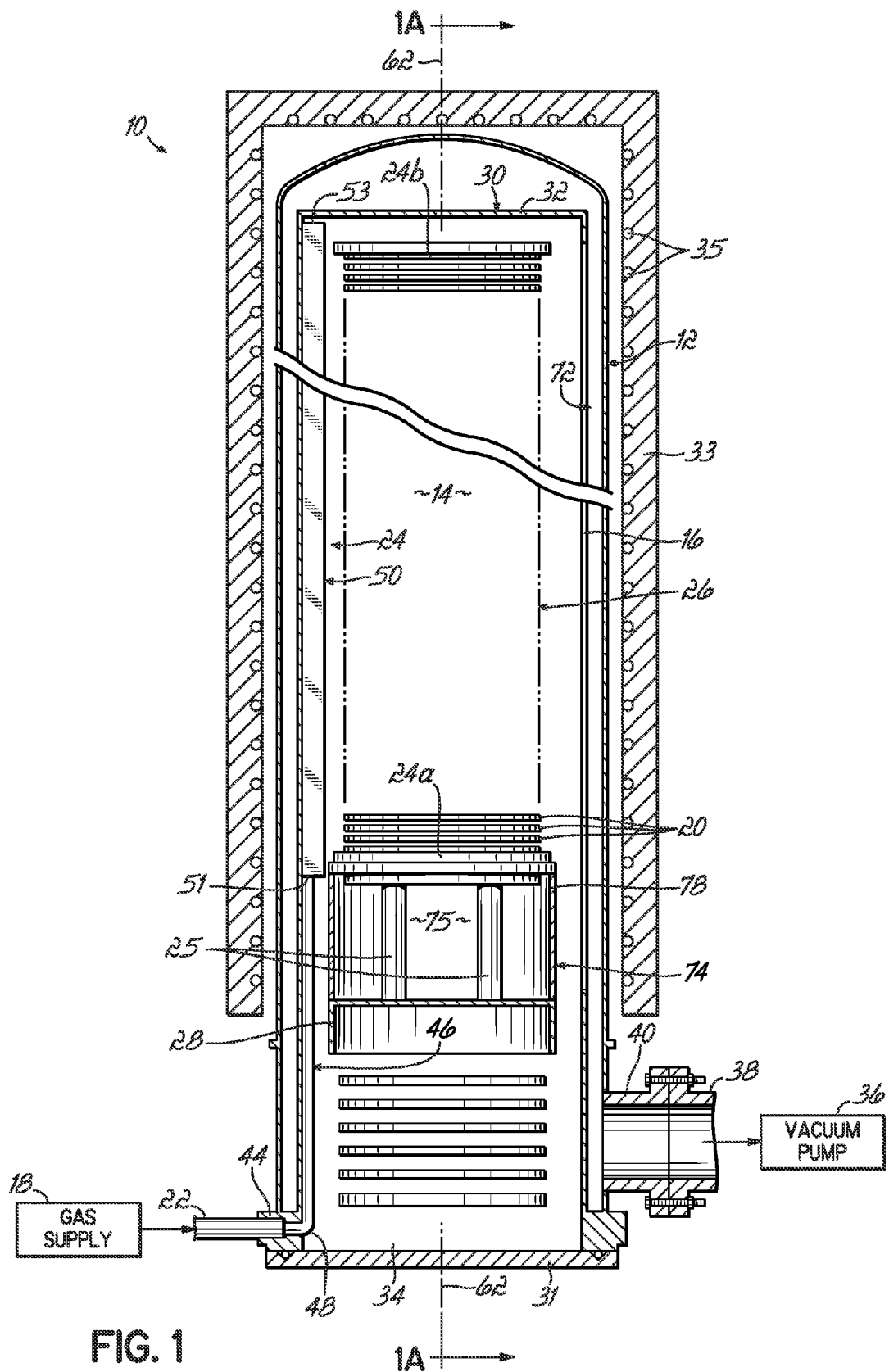
FIG. 1 is a cross sectional front view of a thermal processing system that includes a gas injector, a liner, and a pedestal shroud in accordance with an embodiment of the invention.

With reference to FIG. 1, a process tool in the form of a thermal processing system 10 comprises an outer vessel or tube 12 and an inner tube or liner 30 disposed radially inside the outer tube 12. The liner 30 surrounds a process chamber or processing space 14 adapted to receive a batch of workpieces or substrates 20. The dimensions of the liner 30, and thus the size of the thermal processing system 10, may be scaled to accommodate substrates 20 of different sizes. The liner 30 may be composed of any high temperature material, such as quartz, silicon carbide, or other suitable ceramic material, and is removable for cleaning to remove accumulated deposits that are an artifact of substrate processing. Liner 30 is generally shaped like a right circular cylinder.

The thermal processing system 10 receives a metered stream or flow of a reactant, such as a process gas supplied from a gas supply 18. During a process run, the processing space 14 contains a partial pressure of the process gas, which is typically electronics grade in purity. The residence time of the process gas in the processing space 14 is sufficient to promote a chemical reaction, possibly with one or more additional process gases, to form a layer on the substrates 20 by deposition or growth. A delivery line 22 communicates a flow of the process gas from the gas supply 18 to a gas injector 24. The gas injector 24 has the form of a conduit stationed inside the processing space 14. The gas injector 24 injects the flow of process gas into the processing space 14 defined inside the liner 30. The injected process gas may comprise, for example, an atomic layer deposition (ALD) precursor.

A carrier in the form of a boat 26, which may be composed of a high-temperature material such as quartz, is disposed inside the thermal processing system 10. The boat 26 is supported on a pedestal 28, which is lifted and lowered by a boat elevator (not shown) for exchanging substrates 20. The boat 26 includes a plurality of substrate holders defining vertically spaced slots for the substrates 20, which are supported about their peripheral edges. The substrate holders of the boat 26 are coupled in a vertically spaced relationship with a plurality of rods 25. The rods 25, which are mounted to the pedestal 28, extend between opposite end plates 24a,b and are arranged relative to each other to provide an access path to each of the slots. Adjacent substrates 20 are held by the boat 26 in a spaced relationship such that unreacted process gas readily passes through a gap, G, defined between each pair of adjacent substrates 20. Unprocessed substrates 20 are inserted into the holders of boat 26 and processed substrates 20 are removed from the substrate holders by an end effector coupled with a wafer-handling robot (not shown).

The liner 30, which peripherally bounds the processing space 14, has a closed end 32 and an open end 34 opposite to the closed end 32. The open end 34 has a sealing engagement with a base plate 31 to form the processing space 14, which completely encloses the substrates 20 during thermal processing. The boat 26 and the substrates 20 held by the boat 26 are disposed inside the liner 30 generally between the closed end 32 and the open end 34 of the liner 30.

A suitable heat source 33, which is positioned outside of the outer tube 12, includes heating elements 35 used to elevate the temperature of the outer tube 12 and liner 30 by heat transfer so that the processing space 14 is surrounded by a hot wall during substrate processing. The heat source 33 also operates to heat the substrates 20. The heat source 33 may be divided into a plurality of heating zones each having an independent power source for controlling the corresponding zone temperature. Temperature sensors (not shown), such as thermocouples or resistance temperature devices, are stationed along the height of the liner 30 and provide temperature information for the different heating zones. The temperature sensors supply feedback used by a temperature controller (not shown) to regulate the monitored temperature of the liner 30 in each of the heating zones. Typically, the zone temperatures of the heat source 33 are regulated to provide a flat or isothermal temperature profile for the liner 30 at a target temperature specified for the process, which is typically in the range of 200° C. to 1200° C. and, more typically, in the range of 250° C. to 800° C. The temperature controller may employ, for example, a proportional integral derivative (PID) algorithm based on feedback from the temperature sensors to determine the power applied to each zone of the heat source 33 based upon the error between the monitor and target temperatures.

Volatile reaction products and unreacted process gas from the process transpiring inside the processing space 14 are evacuated by a vacuum pump 36, which is coupled by a foreline 38 with a vacuum port 40 penetrating the outer tube 12 near the open end 34 of the liner 30. During operation, the evacuation of the processing space 14 is continuous, as is the injection of the process gas by the gas injector 24. Adjustment of the pumping speed of gases through foreline 38 and vacuum port 40 allows the pressure within the processing space 14 to be set.

A fluid feedthrough 44 is mounted to a port in the liner 30 near the open end 34 of the thermal processing system 10. The gas injector 24 is coupled with the delivery line 22 from the gas supply 18 by the fluid feedthrough 44. The delivery line 22, which is commonly made of a stainless steel, is transitioned in the fluid feedthrough 44 to communicate with the gas injector 24, which is commonly formed from a ceramic like quartz. In this manner, the process gas is transferred from the environment surrounding the thermal processing system 10 to the processing space 14 inside the liner 30.

Gas injector 24 has a tubular delivery section 46 that enters the liner 30 at a fluid entrance point via fluid feedthrough 44 and then bends at a near right angle 48 to extend vertically near the wall of the liner 30. The delivery section 46 joins or merges with a tubular injection section 50 of the gas injector 24 that is positioned radially between the liner 30 and the boat 26. The intersection of the delivery section 46 with the injection section 50 defines an inlet 49 (FIG. 2) for process gas, which is communicated from the delivery section 46 to the injection section 50. The inlet 49 extends through at one end 51 of the injection section 50. The injection section 50 creates a rise that extends to a capped end 53 proximate to the closed end 32 of the liner 30. The radial proximity of the injection section 50 to the heated liner 30 rapidly heats the process gas flowing through the gas injector 24 significantly above the entry temperature into the thermal processing system 10.

With reference to FIGS. 2-4 in which like reference numerals refer to like features in FIG. 1, the injection section 50 of the gas injector 24 is a tubular conduit having an outer surface 55 separated from an inner surface 57 by a sidewall 54 of a given thickness. The inner surface 57 of the injection section 50 bounds a fluid lumen 56 through which the process gas flows. The delivery section 46 is a tubular conduit that includes a fluid lumen 45 that intersects the inlet 49 to the fluid lumen 56 inside the injection section 50 at a location below the boat 26. As is apparent from FIG. 3, the fluid lumen 45 of delivery section 46 is offset from the centerline of the fluid lumen 56 at the inlet 49 so that the fluid lumens 45, 56 are not coaxial, although the invention is not so limited.

The tubular conduit comprising delivery section 46 has an inner surface 39 separated from an outer surface 41 by a sidewall 43. An open end 37 of the delivery section defines a gas entry point that is coupled with the gas supply 18 (FIG. 1). The fluid lumen 45 of the delivery section 46 may have a circular or round cross-sectional profile, when viewed axially, characterized by an inner diameter, $d_i$, and an outer diameter, $d_o$.

At least a portion of the fluid lumen 56 of the tubular conduit comprising the injection section 50 is characterized by a cross-sectional profile having a larger cross-sectional area than the cross-sectional area of the cross-sectional profile of fluid lumen 45. In the exemplary embodiment, the fluid lumen 56 has substantially rectangular cross-sectional profile, when viewed axially along the length, $L_f$, of the injection section 50, such that the cross-sectional profile of fluid lumen 56 is likewise substantially rectangular. The cross-sectional area of the fluid lumen 56 is equal to the product of its first and second minor dimensions, X and Y.

In alternative embodiments, the fluid lumen 56 may have a triangular, square, or even circular cross-sectional profile. Regardless of the cross-sectional profile, the cross-sectional area of at least a portion of the fluid lumen 56 in the injection section 50 is larger than the cross-sectional area of fluid lumen 45 in the delivery section 46. In one embodiment, the cross-sectional area of at least a portion of the fluid lumen 56 in the injection section 50 may be at least about three times greater than the cross-sectional area of fluid lumen 45 in the delivery section 46. In one embodiment, the increased cross-sectional area of fluid lumen 56, in comparison with fluid lumen 45, may extend along the entire length of the injection section 50, although the invention is not so limited.

Distributed along the injection section 50 of the gas injector 24 is a plurality of injection outlets 52. Each of the injection outlets 52 is symmetrical about a centrally aligned axis 58, which is oriented generally radially relative toward a central azimuthal axis 62 (FIG. 1). The outer tube 12 and liner 30 are generally symmetrical and coaxial about the azimuthal axis 62. Although the injection outlets 52 are shown as circular, the embodiments of the invention are not so limited as other open geometrical shapes may be used. The injection outlets 52 may have a uniform diameter that does not depend upon location along the length of the injection section 50.

The injection outlets 52 have a pitch or center-to-center distance, S, measured between the corresponding central axes 58 of adjacent outlets 52. In one embodiment, the pitch of the injection outlets 52 may be uniform along the length of the injection section 50. The pitch of the injection outlets 52 may be selected such that the axis 58 of each gas injection outlet 52 is aligned generally with the mid-point of the gap, G, between a nearest adjacent pair of substrates 20 held in the boat 26.

In an exemplary embodiment of the invention, the fluid lumen 56 has a first minor dimension, X, of about 16 mm and a second minor dimension of about 12 mm, and the sidewall 54 of the gas injector 24 has a wall thickness of about 1.3 mm. The fluid lumen 56 has a cross-sectional area of about 190 mm$^2$. The conduit forming delivery section 46 has an inner diameter, $d_i$, of about 7 mm and an outer diameter, $d_o$, of about 9.5 mm. The cross-sectional area of the fluid lumen 45 is about 45 mm$^2$. Gas outlets 52 are distributed along the length of the injection section 50 with a pitch of about 5.2 mm, which corresponds to the pitch, S, of the substrates 20 in the boat 26, and have a diameter of about 0.5 mm. The injection section 50 has a length of about 900 mm and the number of gas outlets 52 is 173. In another exemplary embodiment, the tubular conduit defining the fluid lumen 56 may be round with an inner diameter of about 12 mm and, thus, a cross-sectional area for the fluid lumen 56 of about 110 mm$^2$.

In different embodiments of the invention, the thermal processing system 10 may include additional gas injectors (not shown), each similar or identical to gas injector 24. These additional gas injectors may be fed process gas originating from gas supply 18 or from a different gas supply (not shown). In this manner, the thermal processing system 10 may be equipped with a plurality of two or more substantially identical gas injectors 24 each equipped with gas injection outlets 52.

Figure 1A:
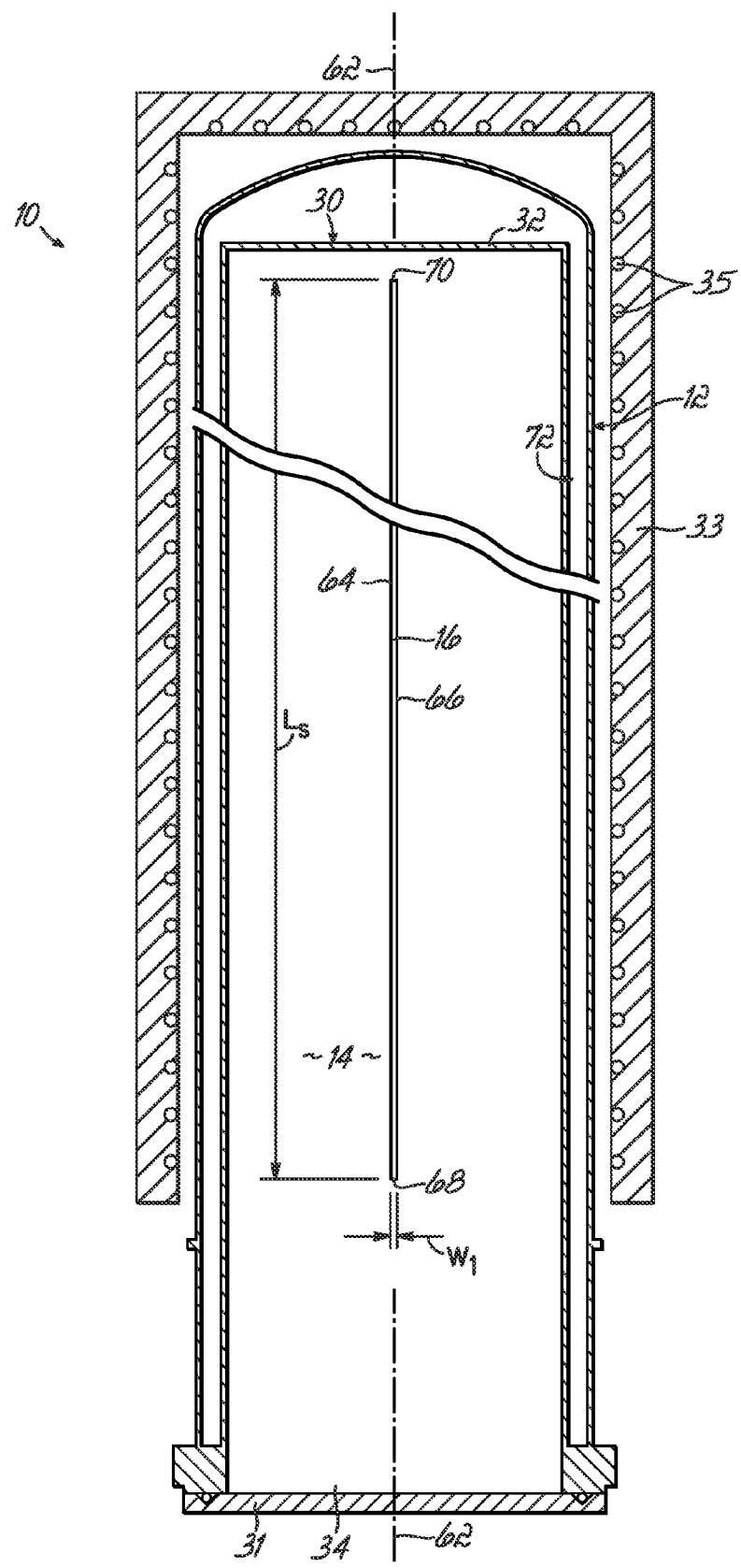
FIG. 1A is an isometric view of the liner of FIG. 1.

With reference to FIGS. 1 and 1A, the liner 30 includes a narrow longitudinal slit 16 bounded by a pair of longitudinal edges 64, 66 generally aligned with the azimuthal axis 62 and a pair of circumferentially-extending transverse edges 68, 70 of substantially equal length that join the longitudinal edges 64, 66 to define closed ends. Slit 16 has a major dimension or length, L, substantially aligned with the azimuthal axis 62 and a circumferentially extending minor dimension or width, $W_1$. The width, $W_1$, is uniform along the major dimension of the slit 16. Slit 16 extends from a position slightly below the base of the boat 26 to a location adjacent to the top of the boat 26.

The slit 16 is located approximately diametrically opposite to the location of the injection section 50 of the gas injector 24. As a result, process gas cross-flow is promoted by the arrangement of the gas injection outlets 52, which inject the process gas, and the slit 16, which provides the outlet for unreacted process gas and volatile reaction products to an annular pumping space 72 disposed between the liner 30 and outer tube 12. The unreacted process gas and volatile reaction products are evacuated from the annular pumping space 72 (FIG. 1) by the vacuum pump 36 at the location of vacuum port 40. The width, $W_1$, of the slit 16 and separation of the longitudinal edges 64, 66 may be selected to provide a targeted cross-flow of process gas across the substrates 20 in the boat 26. In the embodiment shown in FIG. 1A, the slit 16 is unbroken and continuous along its length, $L_s$, and along its width, $W_1$, although the slit 16 may be segmented in alternative embodiments. In a specific embodiment, the width, $W_1$, of slit 16 may be about 5 millimeters (mm).

Slit 16 is believed to provide better gas dispersion for the process gas injected from the gas injector 24 by focusing the flow symmetrical about the opposite faces of the substrates 20. Although not wishing to be limited by theory, the slit 16 is believed to increase the gas velocities of the process gas injected from the gas injection outlets 52, in comparison with a conventional line of gas exhaust openings of progressively increasing diameter, because the slit 16 presents a larger resistance to gas flow than the gas exhaust openings found in conventional liners.

Figure 1B:
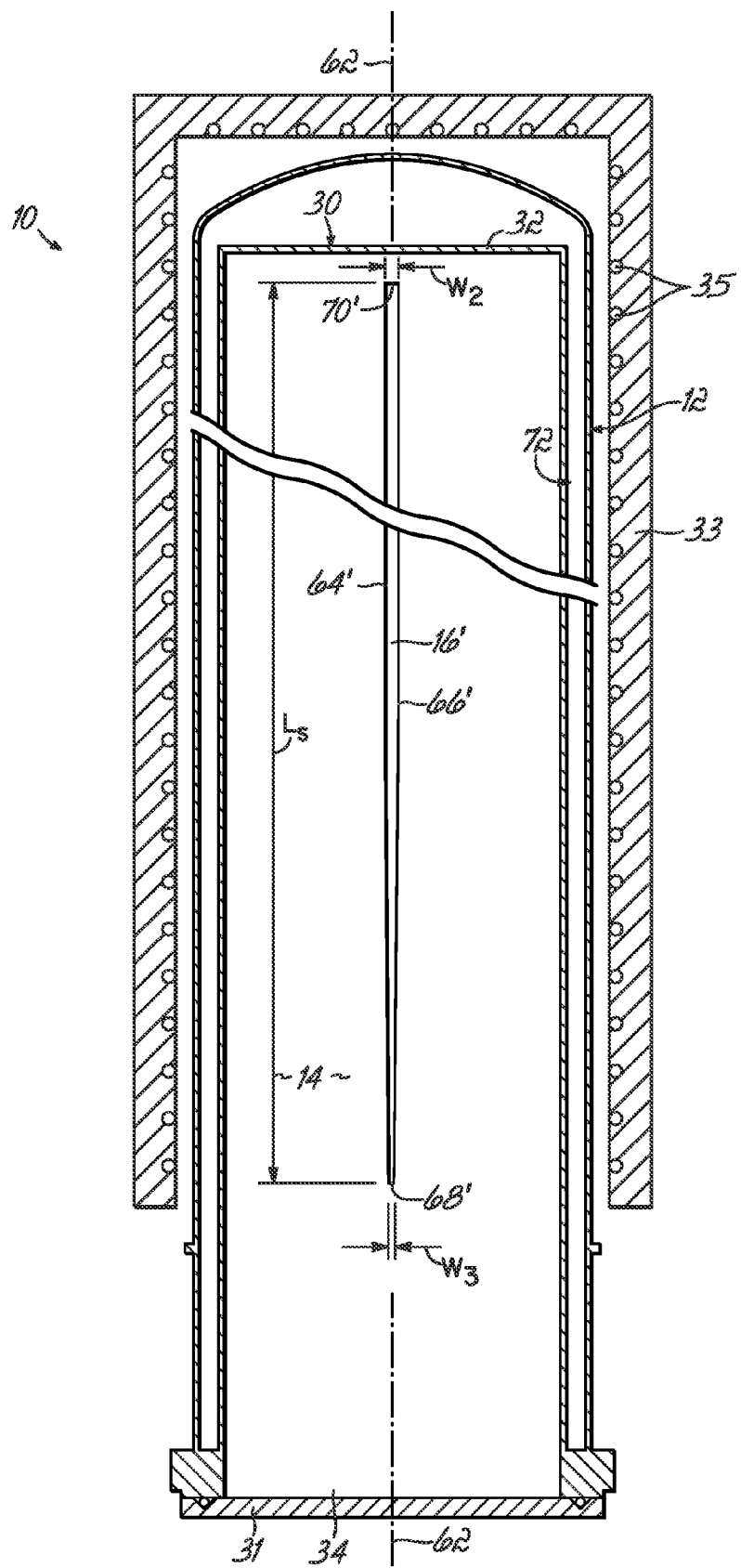
FIG. 1B is an isometric view similar to FIG. 1A of a liner in accordance with an alternative embodiment of the invention.

With reference to FIG. 1B in which like reference numerals refer to like features in FIG. 1A and in an alternative embodiment, liner 30 may include a longitudinal slot or slit 16' bounded by a pair of longitudinal edges 64', 66' generally aligned with the azimuthal axis 62 and a pair of circumferentially-extending transverse edges 68', 70' that join the longitudinal edges 64', 66'. The width, $W_2$, of transverse edge 70' is greater than the width, $W_3$, of transverse edge 68'. At least a portion of the slit 16' is tapered to accommodate the tapering. In the exemplary embodiment of FIG. 1B, transverse edge 68' is shorter than transverse edge 70' and the slit 16' is tapered in a direction from edge 70' to edge 68' with the tapering initiated near the midpoint of the length, $L_s$, of the slit 16'. Conversely, the tapering of slit 16' may be reversed so that slit 16' is tapered in a direction from edge 68' to edge 70'. The tapering may extend along a portion of slit 16', as shown, or may extend along the entire length, $L_s$, of the slit 16'.

With renewed reference to FIG. 1, a pedestal cover or shroud 74 is disposed above the pedestal 28. The shroud 74 comprises a thin-walled, ring-shaped component with an annular sidewall 78 that extends about the pedestal 28. The sidewall 78 of the shroud 74 extends downwardly to contact the pedestal 28 so as to define a partition that at least partially encloses a substantially open space 75 located above the pedestal 28 and below the boat 26. Although not wishing to be limited by theory, at least partially closing the open space 75 with shroud 74 is believed to decrease the flow dispersion of unreacted process gas and volatile reaction products flowing through the annular pumping space 72 to the vacuum port 40 and to increase the average flow velocity between adjacent substrates 20. This improves the conductance for process gas flow past the open space 75 by reducing turbulence and, thereby, promoting laminar or molecular flow. In other words, the shroud 74 effectively blocks the high conductance path for process gas through the open space 75 to the slit.

In use and with reference to FIGS. 1, 1A, 2, 3, and 4, a process run is initiated with the liner 30 held at an idle temperature elevated significantly above room temperature. The substrates 20 are loaded into the boat 26 and the temperature of the liner 30 is ramped up to the target process temperature. Process gas is directed from the gas supply 18 at a controlled flow rate to the gas injector 24. Heat transferred from the liner 30 heats the process gas over the vertical rise of the gas injector 24 toward the closed end 32 of liner 30. The heated process gas is injected into the processing space 14 from the gas injection outlets 52 spaced along the length of the gas injector 24. The process gas and/or its reaction products may chemically react with the heated substrates 20 to form a surface layer on each substrate 20. Unreacted process gas and volatile reaction products are evacuated from the processing space 14 inside the liner 30 through the slit 16, into the annular pumping space 72, and ultimately to the vacuum port 40. The shroud 74 at least partially covers the open space 75 between the pedestal 28 and boat 26 so that the gas flow is more efficient between the base of the boat 26 and the vacuum port 40. After a given dwell time at the process temperature sufficient to accomplish the desired process, the process gas flow is discontinued, the liner 30 is cooled back to an idle temperature, and the processed substrates 20 are unloaded from the boat 26. Unprocessed substrates 20 are loaded into the boat 26 and another process run is initiated.

With reference to FIGS. 5-7 in which like reference numerals refer to like features in FIGS. 1-4, a gas injector 80 in accordance with an alternative embodiment of the invention may be substituted for the gas injector 24 (FIGS. 1-4) in the thermal processing system 10. Gas injector 80 includes a baffle 84 disposed inside the injection section 50 and extending along a partial length, $L_B$, of the entire length, $L_I$, of the injection section 50. The baffle 84 isolates a tubular extension lumen 88 from a chamber 86 of the fluid lumen 56 inside the injection section 50, and effectively extends the fluid lumen 45 of delivery section 46 into the injection section 50. A first end 90 of the baffle 84 is coupled with the first end 51 of the injection section 50. A second end 94 of the baffle 84 terminates between the opposite ends 51, 53 of the injection section 50.

The inflowing process gas from the fluid lumen 45 of delivery section 81 is communicated through inlet 49 to tubular extension lumen 88, which effectively extends the fluid lumen 45 into the interior of the injection section 50. Baffle 84 isolates the chamber 86 of fluid lumen 85 from the extension lumen 88 so that those gas injection outlets 52 communicating with chamber 86 are isolated from the process gas flowing in extension lumen 88. Instead, the inflowing process gas flows to a second inlet 95 defined at the intersection between the extension lumen 88 and the fluid lumen 56, which is at the second end 94 of the baffle 84. The extension lumen 88 effectively displaces the second inlet 95 along the length, $L_s$, of the injection section 82 to a location remote from the first end 51. The process gas entering the second inlet 95 from the extension lumen 88 flows through lumen 56 toward the capped second end 53 of the injection section 50 and also flows through the chamber 86 of fluid lumen 56 toward the first end 51 of the injection section 50. The presence of the baffle 84 is believed to tend to substantially equalize the gas flux exiting from gas injection outlets 52 that communicate with the chamber 86 of fluid lumen 56 and gas injection outlets 52 communicating with the fluid lumen 56 between the second end 94 of the baffle 84 and the second end 53 of the injection section 50.

The baffle 84 has a major dimension or length, $L_B$, measured between the ends 90, 94 that is less than a major dimension or length, $L_I$, of the injection section 50, which places the second inlet 95 at a location that coincides with the location of the second end 94. In embodiments of the invention, the ratio of $L_B/L_I$ may be in the range of about 0.4 to about 0.5. In other words, the length, $L_B$, of the baffle 84 is equal to a product between a multiplicative factor ranging from about 0.4 to about 0.5 and the length, $L_I$, of the injection section 50. In a specific embodiment of the invention, the ratio of $L_B/L_I$ may be selected to be about 0.5. In another specific embodiment of the invention, the ratio of $L_B/L_I$ may be selected to be about 0.4 so that the length, $L_B$, of the baffle 84 is less than half of the length, $L_I$, of the injection section 50. Despite the presence of the baffle 84, the cross-sectional area of at least a portion of the fluid lumen 56 in the injection section 50 is larger than the cross-sectional area of fluid lumen 45 in the delivery section 46 and the cross-section area of the extension lumen 88.

In an exemplary embodiment of the invention, the fluid lumen 56 has a first minor dimension, X, of about 16 mm and a second minor dimension of about 12 mm, and the sidewall 54 of the gas injector 24 has a wall thickness of about 1.3 mm. The fluid lumen 56 has a cross-sectional area of about 190 mm$^2$. The conduit forming delivery section 46 has an inner diameter, $d_i$, of about 7 mm and an outer diameter, $d_o$, of about 9.5 mm. The cross-sectional area of the fluid lumen 45 is about 45 mm$^2$. Gas outlets 52 are distributed along the length of the injection section 50 with a pitch of about 5.2 mm, which corresponds to the pitch, S, of the substrates 20 in the boat 26, and have a diameter of about 0.5 mm. The injection section 50 has a length of about 900 mm and the number of gas outlets 52 is 173. The cross-sectional area of the extension lumen 88 is about 35 mm$^2$ and the cross-sectional of the chamber 86 is about 145 mm$^2$.

In alternative embodiments of the invention, the inlet 95 may comprise an opening in the baffle 84 establishing fluid communication between the extension lumen 88 and the fluid lumen 56 at a location between the ends 90, 94 of baffle 84. In this alternative embodiment, the second inlet 95 does not coincide solely with the second end 94 of baffle 84. In other alternative embodiments of the invention, the second inlet 95 may comprise multiple openings communicating between the fluid lumens 56, 84.

Figure 8:
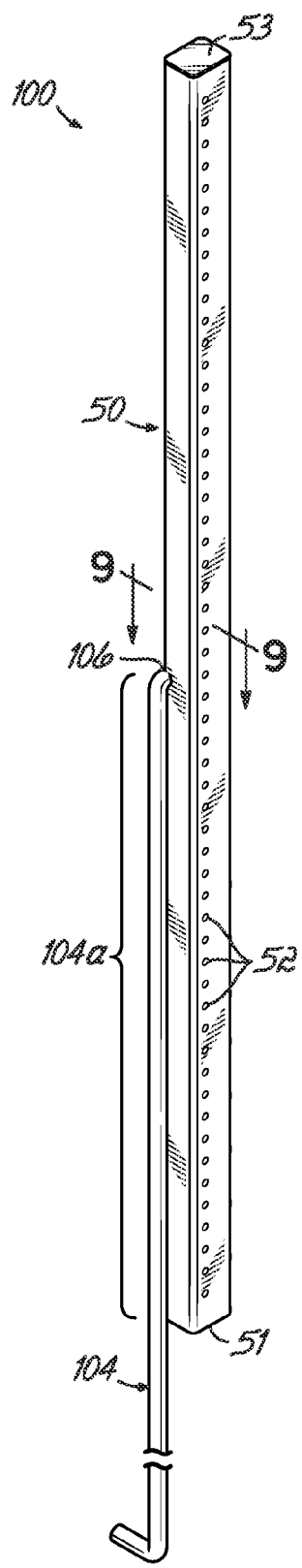
FIG. 8 is an isometric view similar to FIGS. 2 and 5 of a gas injector in accordance with an alternative embodiment of the invention.
Figure 9:
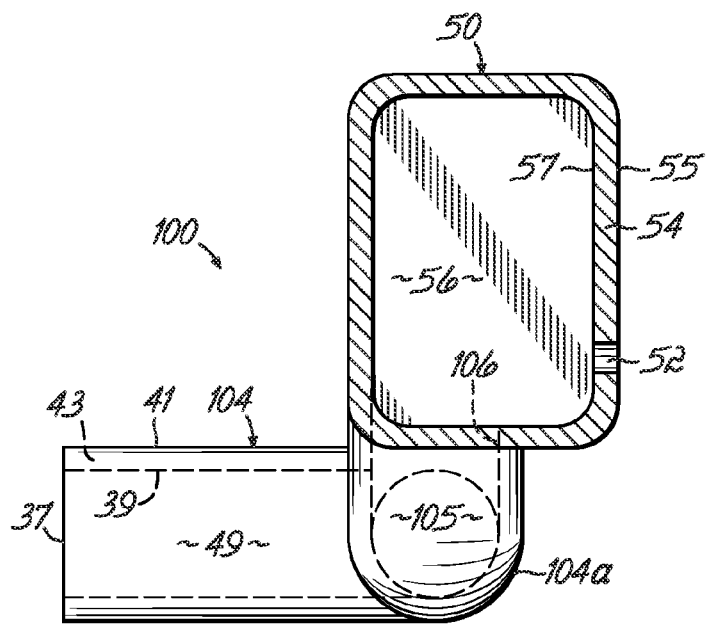
FIG. 9 is a cross-sectional view taken generally along line 9-9 of FIG. 8.

With reference to FIGS. 8 and 9 in which like reference numeral refer to like features in FIGS. 1-4, a gas injector 100 in accordance with an alternative embodiment of the invention may be substituted for either gas injector 24 (FIGS. 1-4) or gas injector 80 (FIGS. 5-7) in the thermal processing system 10. Gas injector 100 includes a delivery section 104 that comprises the delivery section 49 (FIGS. 1-7) in combination with an extension portion 104a disposed completely outside or exteriorly of the injection section 50. Delivery section 104 comprises a tubular conduit that extends adjacent to the injection section 50 and joins the injection section 50 at an inlet 106 located between opposite ends 51, 53 of the injection section 50. A lumen 105 inside of the extension portion is similar in function to the extension lumen 88 created by baffle 84 (FIGS. 5-7). Specifically, the fluid lumen 105 of the delivery section 104 is extended to supply the process gas to the inlet 106 that is located between the ends 51, 53 in analogy to the location of the second end 94 of baffle 84.

The fluid lumen 105 inside the extension section 104a of delivery section 104 communicates with the fluid lumen 56 inside the gas injection section 50 for transferring a stream of process gas to the injection section 50. Process gas is injected from gas injection outlets 52 into the processing space 14

(FIG. 1) inside the liner 30 of thermal processing system 10. Gas injection outlets 52 near the opposite ends 51, 53 of the injection section 50 are disposed remote from the inlet 106. This is believed to substantially equalize the mass flux from the gas injection outlets 52 located along the length, $L_I$, of the injection section 50.

The invention, in its various embodiments, provides more uniform substrate-to-substrate deposition among different substrates in any batch processed by a single process run and also improves uniformity among the substrates in successively processed batches. The invention, in its various embodiments, also reduces cost by increasing the uptake of the process gas so that the reaction efficiency of the process gas is enhanced and less unreacted process gas is evacuated from the thermal processing system. The invention, in its various embodiments, also provides flexibility in the thermal processing system design for a wide dynamic flow range of process gas.

Further details and embodiments of the invention will be described in the following examples and contrasted with comparative examples representative of the prior art.

EXAMPLES AND COMPARATIVE EXAMPLES

Example 1

Fluid flow inside a representative thermal processing system similar to thermal processing system 10 (FIG. 1) was simulated by computational modeling using FLUENT computational fluid dynamics (CFD) software executing on a 64-bit dual CPU workstation. The CFD modeling relies on a numerical computation using a finite element code embodied in the CFD software, in which a volume inside the thermal processing system is modeled with discrete volume elements or cells. The CFD software FLUENT is commercially available from Fluent, Inc. (Centerra Resource Park, 10 Cavendish Court, Lebanon, N.H.). Other CFD modeling packages are well known in the art.

The system modeled by way of the CFD computation was a 200 mm cross flow Alpha 8SE thermal processing tool, which is commercially available from Tokyo Electron Limited, configured with a 173 hole gas injector similar to the gas injector of FIGS. 5-7. The processing space was resolved into approximately 2.5 million cells for the high-resolution simulation. The processing space was loaded with 170 wafers at a 5.2 mm pitch (e.g., pitch S in FIG. 4). Nitrogen was used as the process gas to model fluid flow. The processing space received a flow of nitrogen gas and was kept under isothermal process conditions. The chamber was fixed at a temperature of 300° C. and radiation-heating effects were not considered in the model. The CFD computation considered the foreline pressure to be fixed at 250 mT and was calculated at different nitrogen gas flows of 333, 1000, and 3000 standard cubic centimeters per minute (sccm).

Figure 10:
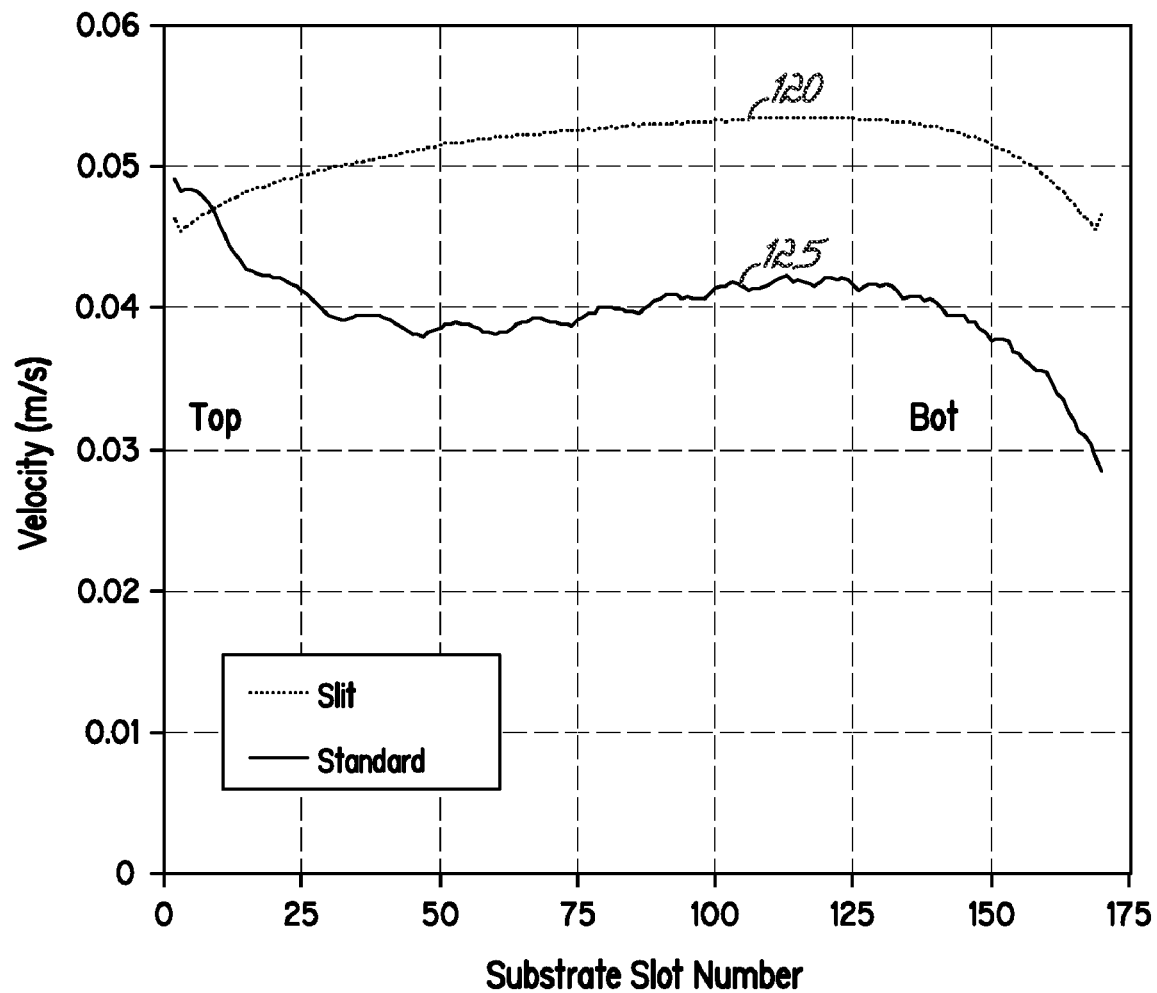
FIG. 10 is a graph showing intra-substrate average gas velocity as a function of substrate slot number in a thermal processing system with a liner constructed similar to the liner of the thermal processing system of FIG. 1 and in a thermal processing system having a liner in accordance with the prior art.

The liner in the CFD computation was configured with a slit having a width (e.g., $W_1$ in FIG. 1A) of 5 mm and a pedestal cover was applied to the pedestal. FIG. 10 is a graph representing the intra-substrate average gas velocity determined from the CFD computation as a function of substrate slot number in a thermal processing system. The slot number represents the location for each substrate held by a wafer boat disposed radially inside the liner with slot # 173 located closest to the pumping port and slot # 1 located remote from the pumping port. The gas velocity at different locations along the length of the liner determined from the CFD computation at a nitrogen gas flow of 333 sccm is displayed in FIG. 10 as line 120.

Comparative Example 1

A simulation was performed with conditions otherwise identical to those of Example 1, other than the introduction into the CFD computation of a conventional liner having a line of gas exhaust openings with progressively increasing diameters. The gas velocity at different locations along the length of the conventional liner calculated using the CFD model is displayed in FIG. 10 as line 125. It is apparent from FIG. 10 that the computed gas velocity, represented by line 125, is significantly lower for a conventional liner than for a liner having a narrow, elongated slit, which has a computed gas velocity represented by line 120 as mentioned above.

Example 2

Figure 11:
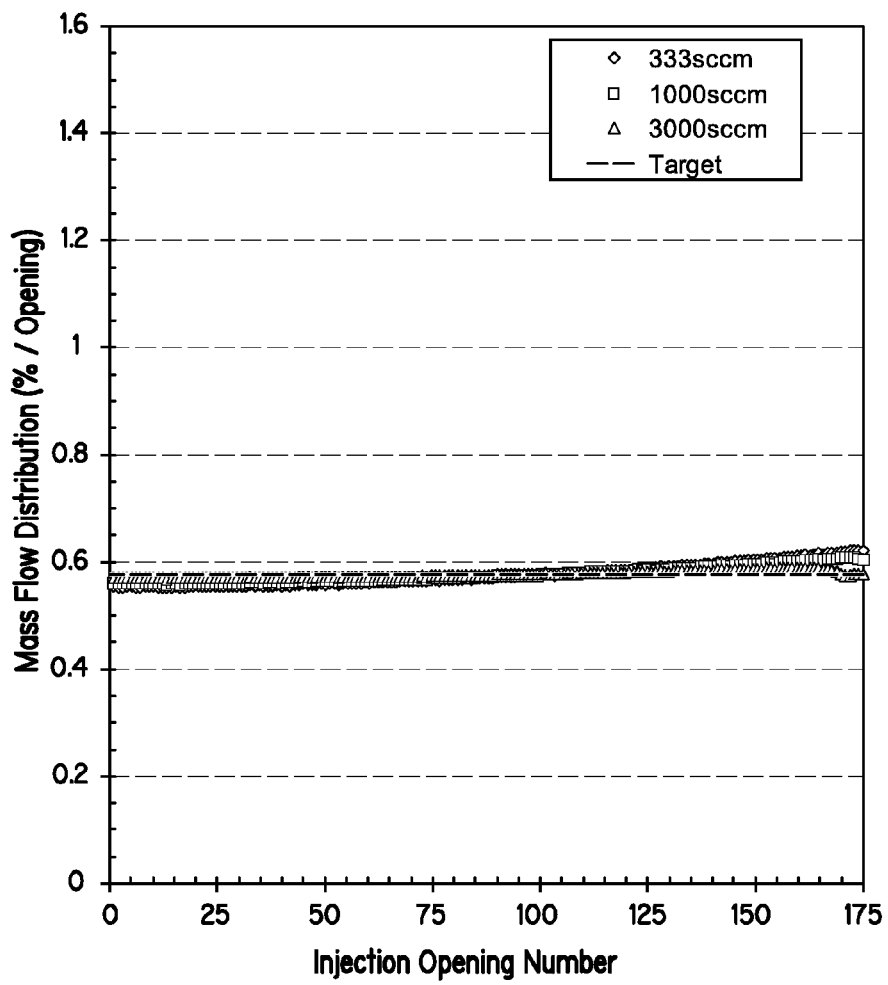
FIG. 11 is a graph showing mass flow distribution as a function of injector hole number in a thermal processing system constructed similar to the thermal processing system of FIG. 1.
Figure 12:
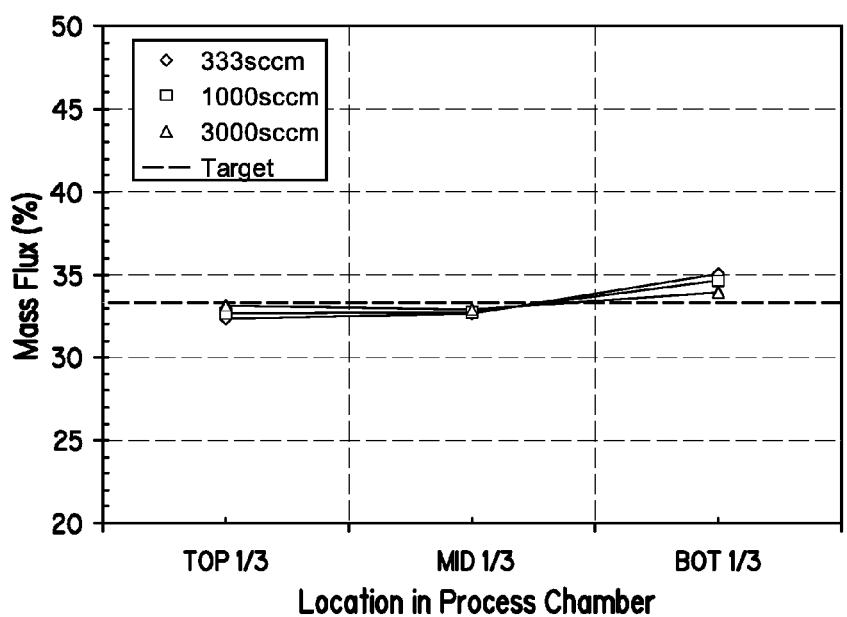
FIG. 12 is a graph showing mass flux as a function of location in the process chamber in a thermal processing system constructed similar to the thermal processing system of FIG. 1.

A CFD computation was performed under conditions identical to those of Example 1 and using a gas injector similar to the gas injector depicted in FIGS. 1-4. FIG. 11 is a graph representing the CFD computation of mass flow distribution as a function of injection opening number for the three different nitrogen gas flows. FIG. 12 is a graph representing the computed mass flux as a function of location in the process chamber for the three different nitrogen gas flows. The top $\frac{1}{3}^{rd}$ of the process chamber is located near the closed end of the liner most remote from the pumping port and the bottom $\frac{1}{3}^{rd}$ of the process chamber is located adjacent to pumping port.

The gas injection outlets or openings were distributed along the length of the gas injector and an average of 0.578% of the total gas flow was directed through each individual opening. At a nitrogen gas flow of 333 sccm, the computed mass flow distribution from the gas injection outlets exhibited a standard deviation of 3.58% and a range of ±5.96%. The range represents the difference in the maximum and minimum computed mass flow. At a nitrogen gas flow of 1000 sccm, the computed mass flow distribution from the gas injection outlets exhibited a standard deviation of 2.59% and a range of ±4.31%. At a nitrogen gas flow of 3000 sccm, the computed mass flow distribution from the gas injection openings exhibited a standard deviation of 1.09% and a range of ±1.85%. As is apparent from FIGS. 11 and 12, variations in process gas flow rate along the length of the gas injector are minimized.

Example 3

Figure 13:
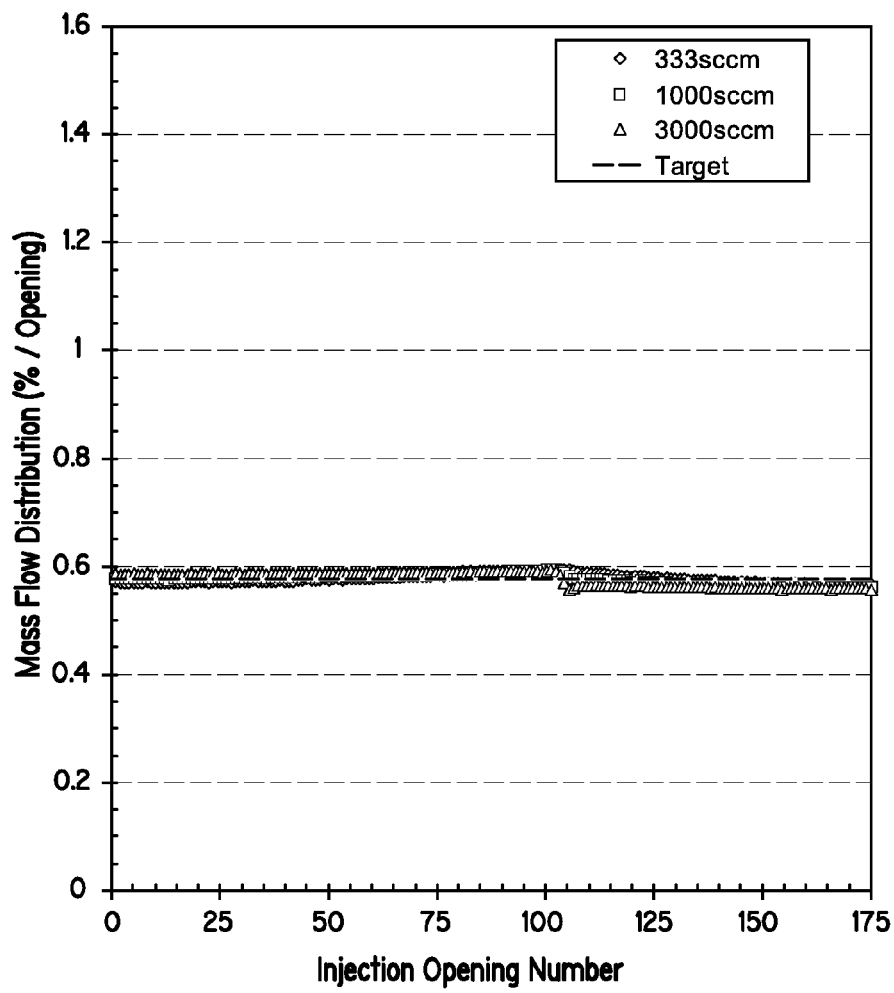
FIG. 13 is a graph showing mass flow distribution as a function of injector hole number in a thermal processing system constructed similar to the thermal processing system of FIG. 1 and utilizing the embodiment of the gas injector depicted in FIGS. 5-7.
Figure 14:
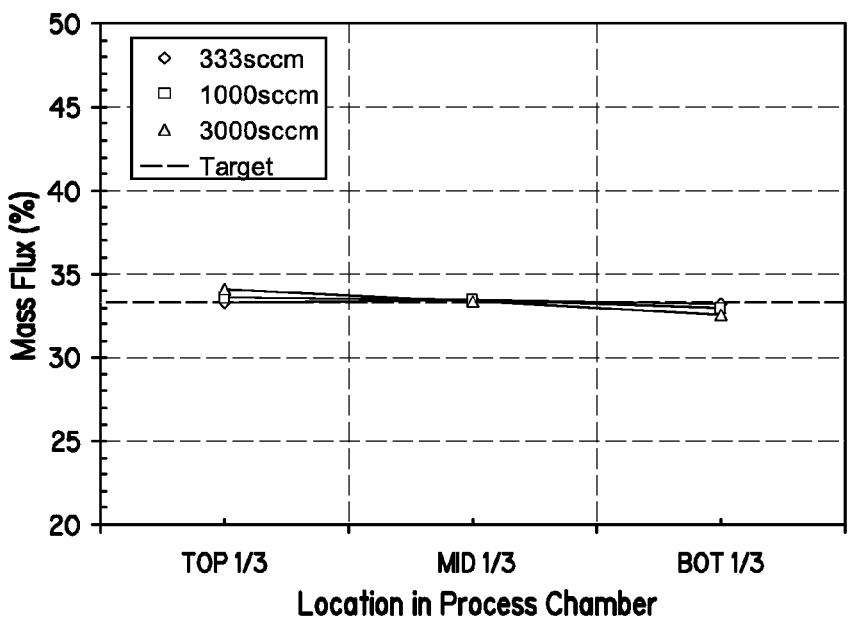
FIG. 14 is a graph showing mass flux as a function of location in the process chamber in a thermal processing system constructed similar to the thermal processing system of FIG. 1 and utilizing the embodiment of the gas injector depicted in FIGS. 5-7.

A CFD computation was performed with conditions identical to those of Example 2, other than the introduction into the CFD model of a gas injector similar to the gas injector of FIGS. 5-7 and having an $L_B/L_I$ ratio of 0.4. FIG. 13 is a graph representing the computed mass flow distribution as a function of injection opening number for the three different nitrogen gas flows. FIG. 14 is a graph representing the computed mass flux as a function of location in the process chamber for the three different nitrogen gas flows.

The gas injection outlets or openings were distributed along the length of the gas injector and an average of 0.578% of the total gas flow was directed through each opening. At a nitrogen gas flow of 333 sccm, the computed mass flow distribution from the gas injection outlets exhibited a standard deviation of 1.33% and a range of ±2.46%. At a nitrogen gas flow of 1000 sccm, the computed mass flow distribution from the gas injection outlets exhibited a standard deviation of 1.53% and a range of ±2.73%. At a nitrogen gas flow of 3000 sccm, the computed mass flow distribution from the gas injection outlets exhibited a standard deviation of 2.30% and a range of ±3.18%. As is apparent from FIGS. 13 and 14, variations in process gas flow rate along the length of the gas injector are minimized.

Comparative Example 2

Figure 15:
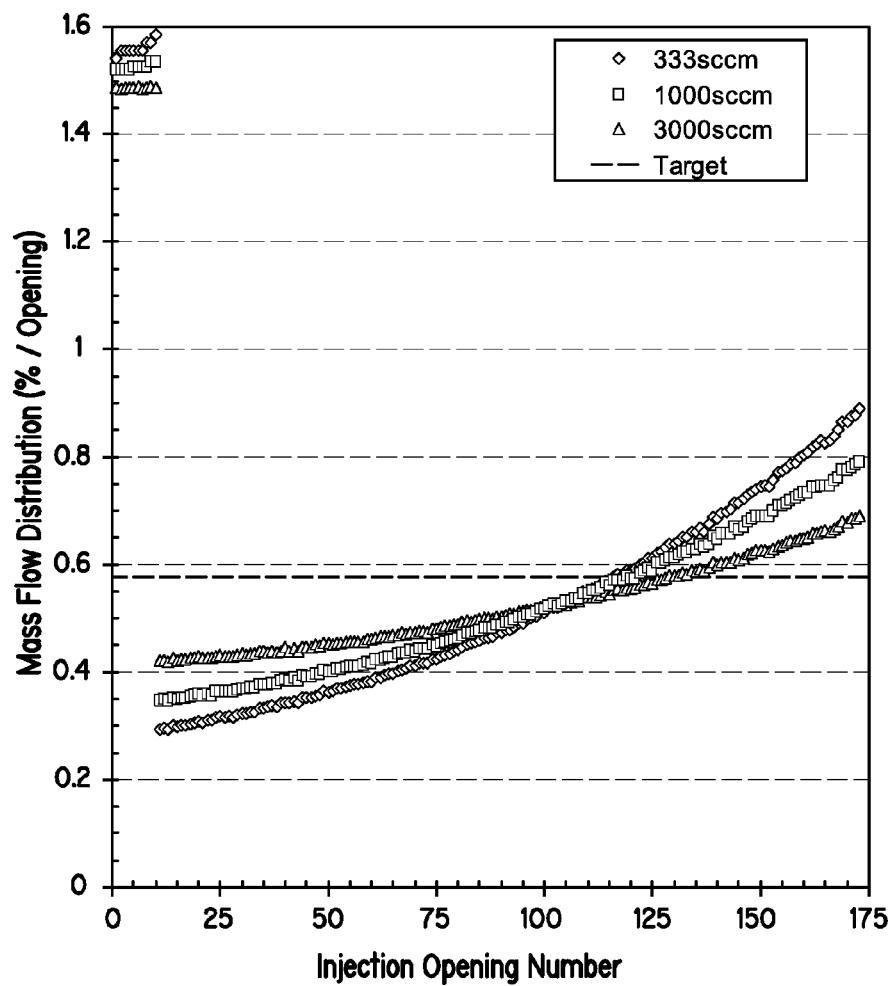
FIG. 15 is a graph showing mass flow distribution as a function of injector hole number in a thermal processing system constructed in accordance with the prior art.
Figure 16:
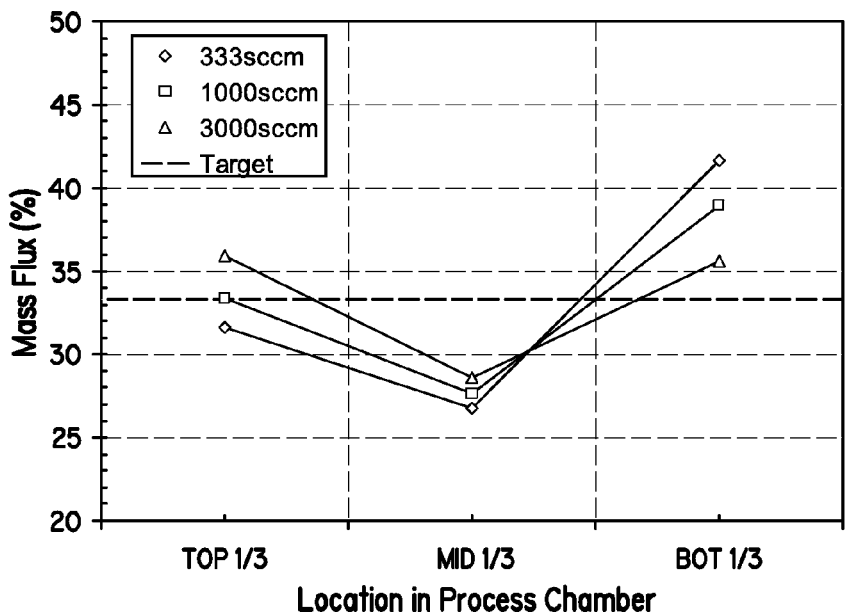
FIG. 16 is a graph showing mass flux as a function of location in the process chamber in a thermal processing system constructed in accordance with the prior art.

A CFD computation was performed with conditions identical to those of Example 2, other than the introduction into the CFD model of a conventional gas injector having 10 gas injection holes with an inner diameter of 0.8 mm grouped at an end remote from the gas entry point and 163 holes with an inner diameter of 0.5 mm between the 10 larger diameter holes and the gas entry point. The gas injection outlets or openings were assigned a pitch of about 5.2 mm and the tube of the gas injector was assigned an outer diameter of 9.52 mm. FIG. 15 is a graph representing the computed mass flow distribution from the conventional gas injector as a function of injection opening number. FIG. 16 is a graph representing the computed mass flux from the gas injection openings in the conventional gas injector as a function of location in the process chamber.

As is apparent from FIGS. 15 and 16, the results of the CFD computation for the thermal processing system with the conventional gas injector exhibit a wide variation in the simulated flow. The gas injection openings were distributed along the length of the gas injector and an average of 0.578% of the total gas flow was directed through each individual opening. At a nitrogen gas flow of 333 sccm, the computed mass flow distribution for the injection outlets exhibited a standard deviation of 29.80% and a range of ±51.47%. At a nitrogen gas flow of 1000 sccm, the computed mass flow distribution for the injection outlets exhibited a standard deviation of 22.47% and a range of ±38.42%. At a nitrogen gas flow of 3000 sccm, the computed mass flow distribution for the injection outlets exhibited a standard deviation of 13.50% and a range of ±23.51%. It is apparent from FIGS. 15 and 16 the conventional gas injector exhibits a wide variation in flow along its length and that the top 10 gas injection openings, which have a significantly larger diameter than the other openings, exhibit a greater flow that influences the region of the process chamber near the top 10 gas injection openings.

Regardless of the specific nitrogen gas flow rate, the variation in the computed flow in Examples 2 and 3 is significantly less than the variation in the computed flow exhibited in the conventional thermal processing system of Comparative Example 2. The significant reduction in the simulated flow variation along the length of the gas injector is believed to be due primarily to the incorporation into the CFD computation of gas injectors constructed according to embodiments of the invention.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A thermal processing system for processing substrates with a process gas, the thermal processing system comprising:

an outer tube;

an inner tube disposed radially inside said outer tube, said inner tube defining a processing space in which the substrates are held for processing with the process gas; and a gas injector having an injection section positioned inside said inner tube and a delivery section, said injection section having a first end, a second end that is closed and opposite to said first end, a baffle attached to said first end and extending from said first end of said injection section toward said second end of said injection section, a first fluid lumen between said first end of said injection section and said second end of said injection section, a second fluid lumen separated from said first fluid lumen by said baffle and extending from said first end of said injection section to said second end of said injection section, a first inlet in said first end that couples said first fluid lumen with said delivery section for communicating the process gas to said first fluid lumen, and a plurality of injection outlets distributed along said second fluid lumen between said first and second ends of said injection section, said injection outlets configured to inject the process gas from said second fluid lumen into said processing space, said first fluid lumen free from said injection outlets, and said first fluid lumen intersecting said second fluid lumen at a second inlet between said first and second ends of said injection section, whereby said first fluid lumen communicates the process gas through said second inlet to said second fluid lumen of said injection section, wherein said injection section has a length measured between said first and second ends and along which said injection outlets are distributed, and said baffle has a length that is equal to a product between a multiplicative factor ranging from about 0.4 to about 0.5 of said length of said injection section.

2. The thermal processing system of claim 1 wherein said injection section has a length measured between said first and second ends, and said gas injection outlets have a substantially uniform diameter independent of a position along said length.

3. The thermal processing system of claim 1 wherein said inner and outer tubes are separated by an annular pumping space, and further comprising:

a carrier configured to hold the substrates, said carrier disposed radially inside said inner tube;

a pumping port extending through said outer tube;

a pedestal supporting said carrier, said pedestal located at least partially between said carrier and said pumping port, and said pedestal separated from said carrier by an open space disposed generally between said processing space and said pumping port; and a tubular partition disposed about said open space, said partition at least partially enclosing said open space for promoting flow of the process gas from said processing space to said annular pumping space.

4. The thermal processing system of claim 1 wherein said inner and outer tubes are separated by an annular pumping space, said injection section has a length measured between said first and second ends, and said inner tube includes a slit having a length substantially aligned with said length of said injection section, said processing space and said annular pumping space communicating through said slit.

* * * * *